United States Patent
Kim et al.

(10) Patent No.: US 9,401,716 B2
(45) Date of Patent: Jul. 26, 2016

(54) LOGIC GATE USING SCHMITT TRIGGER CIRCUIT

(71) Applicant: RESEARCH & BUSINESS FOUNDATION SUNGKYUNKWAN UNIVERSITY, Suwon-si (KR)

(72) Inventors: So Young Kim, Suwon-si (KR); Kyung Soo Kim, Suwon-si (KR); Wan Soo Nah, Seongnam-si (KR)

(73) Assignee: RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 0 days.

(21) Appl. No.: 14/590,622

(22) Filed: Jan. 6, 2015

(65) Prior Publication Data

US 2015/0303918 A1   Oct. 22, 2015

(30) Foreign Application Priority Data

Apr. 16, 2014 (KR) .................. 10-2014-0045189

(51) Int. Cl.
| | |
|---|---|
| H03K 19/00 | (2006.01) |
| H03K 19/20 | (2006.01) |
| H03K 19/0185 | (2006.01) |
| H03K 3/3565 | (2006.01) |

(52) U.S. Cl.
CPC .... *H03K 19/0016* (2013.01); *H03K 19/018507* (2013.01); *H03K 19/018521* (2013.01); *H03K 19/20* (2013.01); *H03K 3/3565* (2013.01)

(58) Field of Classification Search
CPC .............. H03K 19/0016; H03K 19/018507; H03K 3/0377; H03K 19/20; H03K 3/013; H03K 19/018521; H03K 3/3565

USPC .......................................... 326/104–122, 83
See application file for complete search history.

(56) References Cited

U.S. PATENT DOCUMENTS

| | | | |
|---|---|---|---|
| 2006/0189409 A1* | 8/2006 | Krumme ...................... 473/342 |
| 2009/0224803 A1* | 9/2009 | Bernstein et al. ............. 326/121 |
| 2009/0237135 A1* | 9/2009 | Ramaraju et al. ............. 327/205 |
| 2015/0263707 A1* | 9/2015 | Kumar .......................... 327/205 |

FOREIGN PATENT DOCUMENTS

| | | | |
|---|---|---|---|
| JP | 2000-22160 A | | 1/2000 |
| JP | 2002-344292 A | | 11/2002 |
| JP | 2006060689 A | * | 3/2006 |

* cited by examiner

*Primary Examiner* — Alexander H Taningco
*Assistant Examiner* — Seojkin Kim
(74) *Attorney, Agent, or Firm* — NSIP Law

(57) ABSTRACT

Logic gates using Schmitt trigger circuits are provided. An AND gate using the Schmitt trigger circuit includes: a NAND gate configured to receive two input signals, perform a NAND logic operation, and output a first output signal; and a DTMOS inverter configured to invert the first output signal, and output the inverted first output signal as a second output signal, and a threshold voltage of the NAND gate is controlled using the second output signal. A OR gate using the Schmitt trigger circuit includes: a NOR gate configured to receive two input signals, perform a NOR logic operation, and output a first output signal; and a DTMOS inverter configured to invert the first output signal, and output the inverted first output signal as a second output signal, and a threshold voltage of the NOR gate is controlled using the second output signal.

13 Claims, 10 Drawing Sheets

LOGIC GATE USING SCHMITT TRIGGER CIRCUIT

CROSS-REFERENCE TO RELATED APPLICATION

This application claims the benefit under 35 USC 119(a) of Korean Patent Application No. 10-2014-0045189, filed on Apr. 16, 2014, the entire disclosure of which is incorporated herein by reference for all purposes.

BACKGROUND

1. Field

The following description relates to a Schmitt trigger circuit, and to a logic gate using a Schmitt trigger circuit.

2. Description of Related Art

A Schmitt trigger circuit is a circuit outputting "0" or "1" by controlling a threshold voltage used as a reference voltage in which an output signal is changed according to a change of an input signal, and making different threshold voltages according to the change of the input signal.

The circuit performs an operation of increasing an output voltage when an input voltage is greater than a predetermined value, and of decreasing the output voltage when the output voltage is equal to or smaller than the predetermined value. The Schmitt trigger circuit is a circuit that sensitively operates according to a value of the input voltage, and is a circuit in which a state of the output voltage changes at two different trigger voltages. That is, the Schmitt trigger circuit changes the state of the output voltage at a lower trigger point (LTP) and an upper trigger point (LTP).

Due to the characteristics, the Schmitt trigger circuit has characteristics in which the output is not easily changed and maintains an original value even when noise is applied to a signal transmission path. Thus, the Schmitt trigger circuits is mainly used to improve noise immunity of the circuit.

Schmitt trigger circuits that are conventionally used, there is a path to flow an additional current for maintaining the output during transition of a signal.

For this reason, a conventional Schmitt trigger circuit needs a transistor for flowing the additional current in addition to a circuit constituting a logic gate, and generally, the number of added transistors is greater than the number of transistors used in a conventional logic gate.

In order to reduce an area of a circuit due to a degree of integration, technology of inserting a buffer using a Schmitt trigger into the conventional circuit has been largely studied, but the technology tends to cause a signal delay difference between different signal transmission paths.

Consequently, the conventional technology has a lot of problems from the point of view of a low power design and also the degree of integration.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one general aspect, there is provided a logic gate capable of improving noise immunity of a low power circuit, improving a degree of integration, and reducing power consumption.

According to one general aspect, there is provided an AND gate using a Schmitt trigger circuit, including: a NAND gate configured to receive two input signals, perform a NAND logic operation, and output a first output signal; and a DTMOS inverter configured to invert the first output signal, and output the inverted first output signal as a second output signal, wherein a threshold voltage of the NAND gate is controlled using the second output signal.

The general aspect of the NAND gate may include a first transistor, a second transistor, a third transistor, and a fourth transistor. Sources of the first and second transistors may be connected to a power supply voltage. Drains of the first and second transistors may be connected to each other. A source of the third transistor may be connected to drains of the first and second transistors. A source of the fourth transistor may be connected to a drain of the third transistor. A drain of the fourth transistor may be connected to a ground voltage.

According to the general aspect of the AND gate, the DTMOS inverter may include a fifth transistor and a sixth transistor. A source of the fifth transistor may be connected to the power supply voltage. A source of the sixth transistor may be connected to a drain of the fifth transistor. A drain of the sixth transistor may be connected the ground voltage. A gate of each of the fifth transistor and sixth transistors may be directly connected to its own body. A body voltage may be controlled by a gate voltage. The drain of the fifth transistor and the source of the sixth transistor may be connected to bodies of the first, second, third, and fourth transistors.

The threshold voltage of the NAND gate may be controlled by feeding back the second output signal to the bodies of the first, second, third, and fourth transistors.

The threshold voltage may include a first threshold voltage ($V_{LH}$) and a second threshold voltage ($V_{HL}$), the first threshold voltage ($V_{LH}$) may be a threshold voltage when the second output signal is transited from a "low" level to a "high" level, and the second threshold voltage ($V_{HL}$) may be a threshold voltage when the second output signal is transited from the "high" level to the "low" level.

Each of the first and second transistors may be a P-channel metal oxide semiconductor (PMOS) transistor, and each of the third and fourth transistors may be an N-channel metal oxide semiconductor (NMOS) transistor.

The fifth transistor may be a PMOS transistor, and the six transistor may be an NMOS transistor.

According to another general aspect, there is provided an OR gate using a Schmitt trigger circuit, including: a NOR gate configured to receive two input signals, perform a NOR logic operation, and output a first output signal; and a DTMOS inverter configured to invert the first output signal, and output the inverted first output signal as a second output signal, wherein a threshold voltage of the NOR gate is controlled using the second output signal.

The NOR gate may include a first transistor, a second transistor, a third transistor, and a fourth transistor. A source of the first transistor may be connected to a power supply voltage. A source of the second transistor may be connected to a drain of the first transistor. Sources of the third and fourth transistors may be connected to a drain of the second transistor. Drains of the third and fourth transistors may be connected to a ground voltage.

The DTMOS inverter may include a fifth transistor and a sixth transistor. A source of the fifth transistor may be connected to the power supply voltage. A source of the sixth transistor may be connected to a drain of the fifth transistor. A drain of the sixth transistor may be connected the ground voltage. A gate of each of the fifth transistor and sixth transistors may be directly connected to its own body. A body voltage may be controlled by a gate voltage. The drain of the fifth transistor and the source of the sixth transistor may be connected to bodies of the first, second, third, and fourth transistors.

The threshold voltage of the NOR gate may be controlled by feeding back the second output signal to the bodies of the first, second, third, and fourth transistors.

The threshold voltage may include a first threshold voltage ($V_{LH}$) and a second threshold voltage ($V_{HL}$), the first threshold voltage ($V_{LH}$) may be a threshold voltage when the second output signal is transited from a "low" level to a "high" level, and the second threshold voltage ($V_{HL}$) may be a threshold voltage when the second output signal is transited from the "high" level to the "low" level.

Each of the first and second transistors may be a PMOS transistor, and each of the third and fourth transistors may be an NMOS transistor.

The fifth transistor may be a PMOS transistor, and the six transistor may be an NMOS transistor.

In another general aspect, there is provided a Schmitt trigger logic gate including: a first logic gate configured to receive two input signals, perform a logic operation, and output a first output signal; and a DTMOS inverter configured to invert the first output signal, and output the inverted first output signal as a second output signal, in which a threshold voltage of the first logic gate is controlled using the second output signal.

The Schmitt trigger logic gate may be an AND gate, and the first logic gate may be a NAND gate. Alternately, the Schmitt trigger logic gate may be an OR gate, and the first logic gate may be a NOR gate.

Other features and aspects will be apparent from the following detailed description, the drawings, and the claims.

Figure 1:
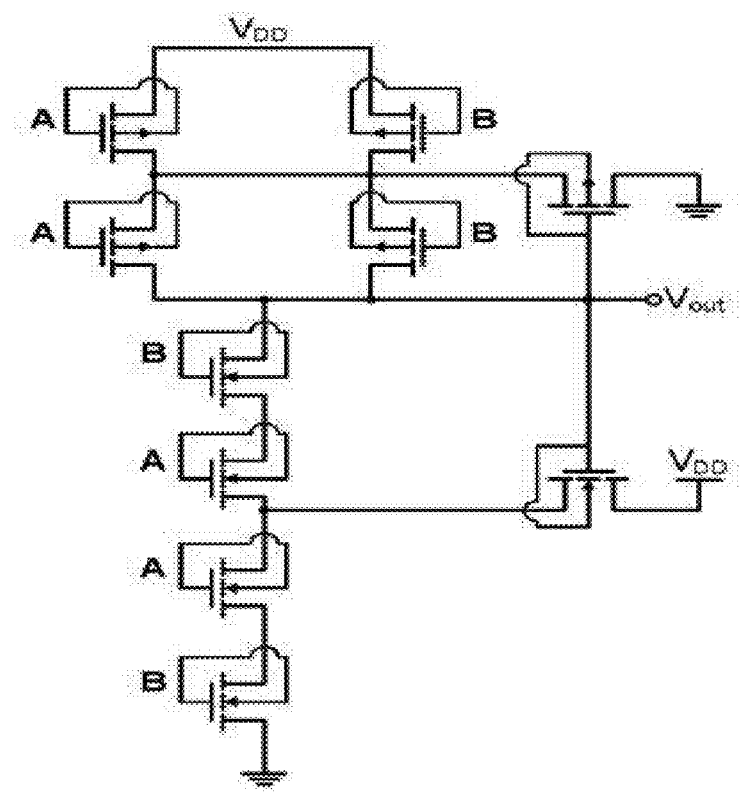
FIG. 1 is a circuit diagram illustrating a conventional Schmitt NAND gate.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

NAND and NOR gates are basic logic elements used for representing a digital logic circuit in a semiconductor integrated circuit. In general, the logic elements used in a digital logic circuit include AND, OR, NOT, NAND, NOR, XOR and XNOR gates. These logic elements do not have a different circuit from each other. Instead, a combination of NAND, NOR and NOT gates defines circuits of the other logic elements. For instance, the circuit of an AND gate is defined by connecting, in series, a NOT gate to the output of a NAND gate. The circuit of an OR gate is defined by connecting, in series, a NOT gate to the output of a NOR gate.

Figure 2:
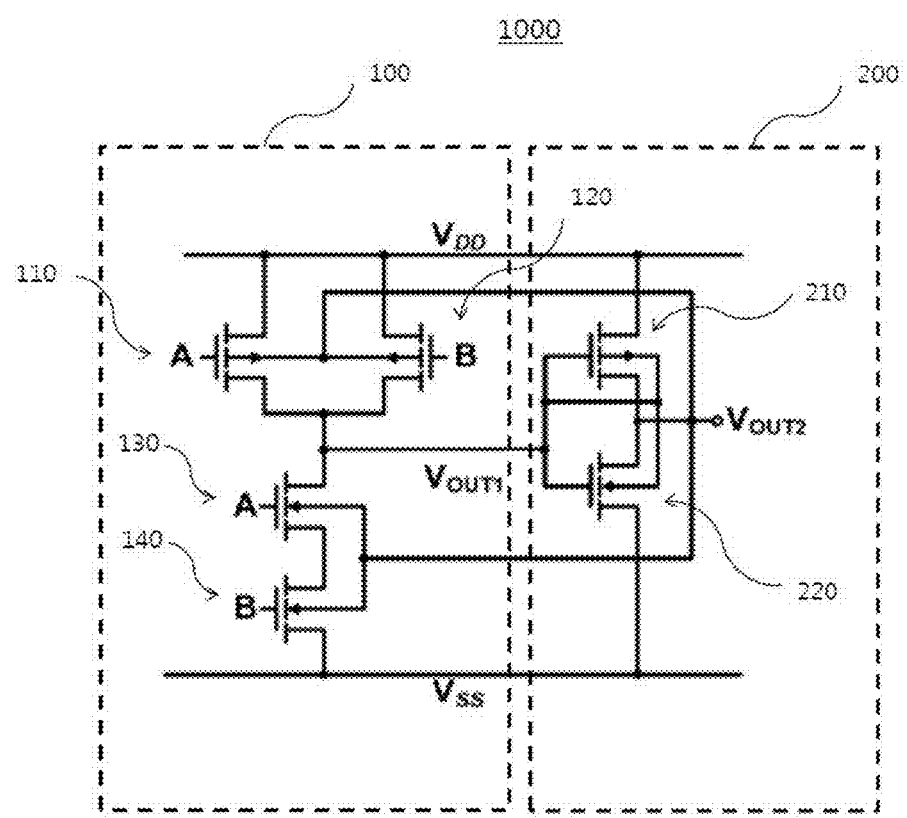
FIG. 2 is a circuit diagram illustrating an example of an AND gate using a Schmitt trigger circuit according to the present disclosure.

FIG. 1 is a circuit diagram illustrating a conventional Schmitt NAND gate, and FIG. 2 is a circuit diagram illustrating an AND gate using a Schmitt trigger circuit according to one example of the present disclosure.

Referring to FIGS. 1 and 2, an example of an AND gate 1000 using a Schmitt trigger circuit according to the present disclosure include a NAND gate 100, and a dynamic threshold voltage metal oxide semiconductor (DTMOS) 200.

The NAND gate 100 may receive two input signals (an input signal A and an input signal B), perform a NAND logic operation, and output a first output signal $V_{OUT1}$.

In this example, the NAND gate 100 includes a first transistor 110, a second transistor 120, a third transistor 130, and a fourth transistor 140. In order to perform a function of the NAND gate, sources of the first transistor 110 and the second transistor 120 may be connected to a power supply voltage $V_{DD}$, drains of the first transistor 110 and the second transistor 120 may be connected to each other. Further, a source of the third transistor 130 may be connected to the drains of the first transistor 110 and the second transistor 120, and a source of the fourth transistor 140 may be connected to a drain of the third transistor 130, and a drain of the fourth transistor 140 may be connected to a ground voltage $V_{SS}$.

As an example, each of the first and second transistors 110 and 120 may be a P-channel metal oxide semiconductor (PMOS) transistor, and each of the third and fourth transistors 130 and 140 may be an N-channel metal oxide semiconductor (NMOS) transistor.

The DTMOS inverter 200 may invert the first output signal $V_{OUT1}$ of the NAND gate 100, and may output the inverted first output signal $V_{OUT1}$ as a second output signal $V_{OUT2}$.

As an example, the DTMOS inverter 200 may include a fifth transistor 210 and a sixth transistor 220. In order to perform a function of the DTMOS inverter, a source of the fifth transistor 210 may be connected to the power supply voltage $V_{DD}$, a source of the sixth transistor 220 may be connected to a drain of the fifth transistor 210, a drain of the sixth transistor 220 may be connected to the ground voltage $V_{SS}$, each of gates of the fifth transistor 210 and the sixth transistor 220 may be connected to its own body, and a body voltage may be controlled by a gate voltage. Further, the drain of the fifth transistor 210 and the source of the sixth transistor 220 may be connected to bodies of the first transistor 110, the second transistor 120, the third transistor 130, and the fourth transistor 140.

As an example, the fifth transistor 210 may be a PMOS transistor, and the sixth transistor 220 may be an NMOS transistor.

The first output signal $V_{OUT1}$ may be an output of the NAND gate 100, and simultaneously, the second output signal $V_{OUT2}$ of the DTMOS inverter 200 may be an output of the AND gate 1000 using the Schmitt trigger circuit according to an example of the present disclosure.

When using the first output signal $V_{OUT1}$, a logic operation of the NAND gate may be performed, and a function of the Schmitt trigger circuit may be performed, and also the number of transistors may have a value obtained by subtracting 4 from the number of transistors constructing the conventional Schmitt NAND gate of FIG. 1. Accordingly, when using the AND gate 1000 using the Schmitt trigger circuit according to an embodiment of the present disclosure, the degree of integration can be improved.

Since the drain of the fifth transistor 210 and the source of the sixth transistor 220 are connected to the bodies of the first to fourth transistors 110, 120, 130, and 140, the second output signal $V_{OUT2}$ output from the DTMOS inverter 200 may control a threshold voltage of the NAND gate 100.

Further, the threshold voltage may include a first threshold voltage $V_{LH}$ and a second threshold voltage $V_{HL}$, the first threshold voltage $V_{LH}$ may be a threshold voltage when the second output signal $V_{OUT2}$ is transited from a "low" level to a "high" level, and the second threshold voltage $V_{HL}$ may be a threshold voltage when the second output signal $V_{OUT2}$ is transited from the "high" level to the "low" level. The "high" level is higher than the "low" level.

Accordingly, a bias of each of the bodies of the transistors constructing the logic gate according to an embodiment of the present disclosure may be determined according to the second output signal $V_{OUT2}$ of the DTMOS inverter 200 which is a final output terminal, and a switching threshold voltage may be varied by a body effect.

As an example, when the input signal A and the input signal B are in the "low" level, the first and second transistors 110 and 120 which are PMOS transistors may be turned on, the first output signal $V_{OUT1}$ may be pulled up to the power supply voltage $V_{DD}$, and the second output signal $V_{OUT2}$ may be pulled down to the ground voltage $V_{SS}$. Further, the second output signal $V_{OUT2}$ of the AND gate 1000 according to an embodiment of the present disclosure may not be changed unless the input signal A or the input signal B is transited from the "low" level to the "high" level. This is because the input signal of the DTMOS inverter 200 is fixed in the "low" level.

However, when one of the input signal A and the input signal B is changed, for example, when the input signal B is in the "high" level, the second transistor 120 which is the PMOS transistor connected to the input signal B may be turned off, and the fourth transistor 140 which is the NMOS transistor connected to the input signal B may be turned on.

When the final output signal $V_{OUT2}$ has a value corresponding to 0, the PMOS transistors among the transistors of a first input stage may be forward-biased, and the NMOS transistors among the transistors of the first input stage may be zero-biased.

In this case, since the input signal has a value corresponding to "0", a signal which is greater than a high threshold voltage is transferred when the input signal is transited from "0" to "1". Similarly, when the final output $V_{OUT2}$ has a value corresponding to "1", the PMOS transistor of the transistors of the first input stage may be zero-biased, and the NMOS transistor of the transistors of the first input stage may be forward-biased. At this time, the threshold voltage of the NMOS transistor becomes smaller than the threshold voltage of the PMOS transistor. Further, at this time, since the input signal is in a state of "1", a case that the input is transited from "1" to "0" may be influenced by a higher threshold value than a case that the input is transited from "0" to "1" in order to transit to a state of "0".

Figure 3:
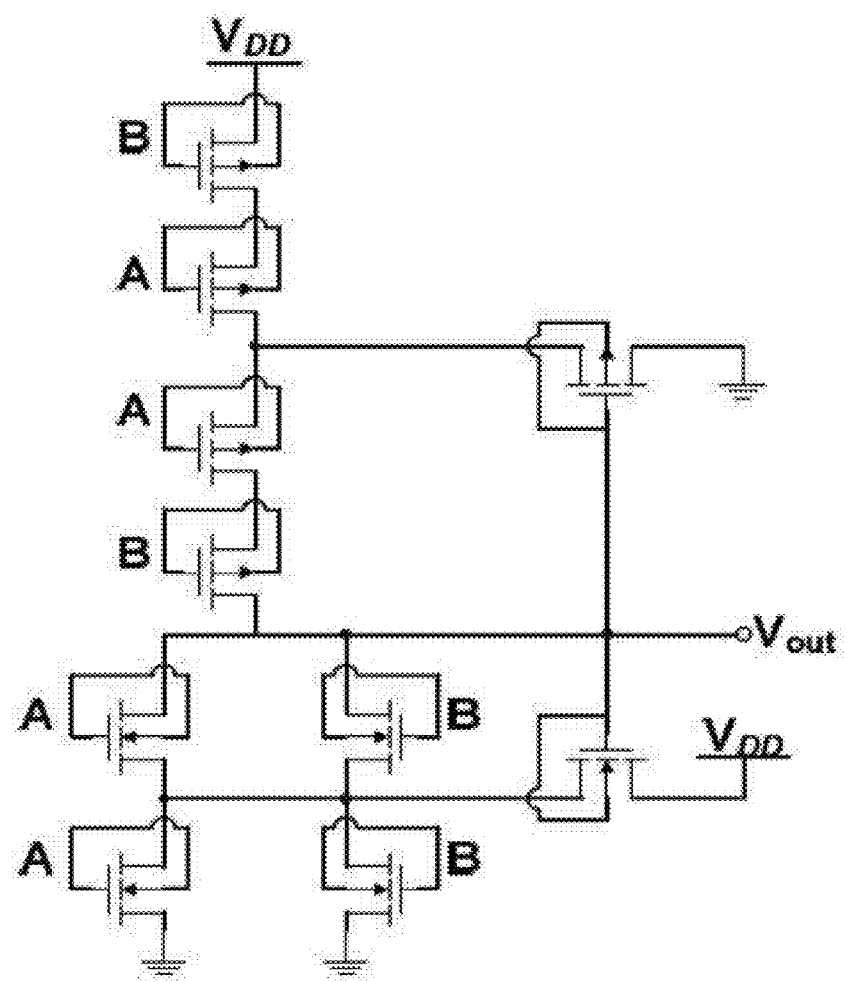
FIG. 3 is a circuit diagram illustrating a conventional Schmitt NOR gate.
Figure 4:
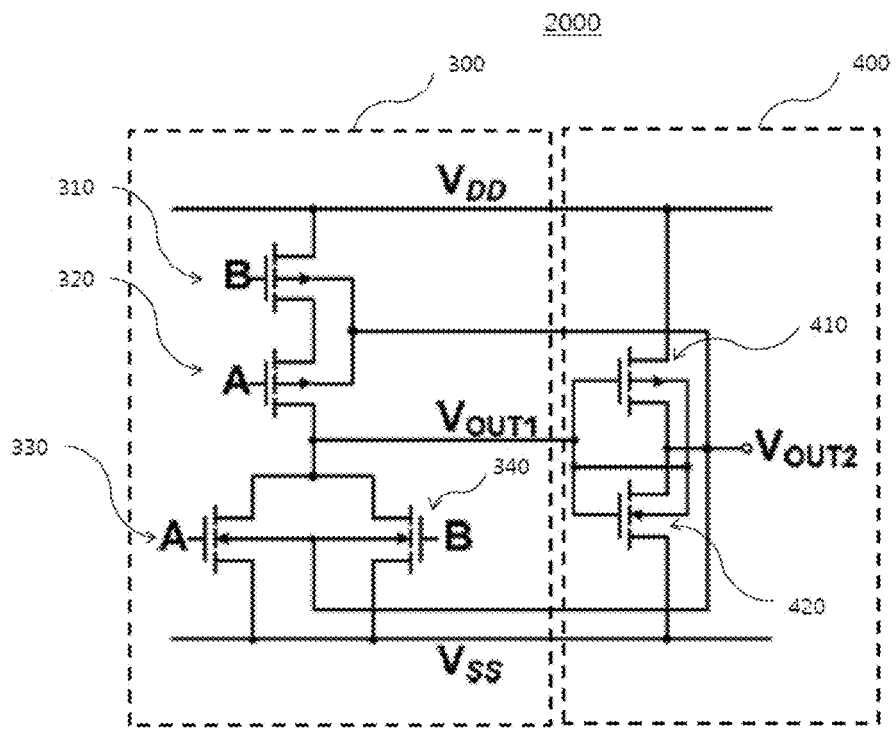
FIG. 4 is a circuit diagram illustrating an example of an OR gate using a Schmitt trigger circuit according to the present disclosure.

FIG. 3 is a circuit diagram illustrating a conventional Schmitt NOR gate, and FIG. 4 is a circuit diagram illustrating an OR gate using a Schmitt trigger circuit according to another embodiment of the present disclosure.

Referring to FIGS. 3 and 4, an OR gate 2000 using a Schmitt trigger circuit according to another embodiment of the present disclosure may include a NOR gate 300, and a DTMOS inverter 400.

The NOR gate 300 may receive two input signals (an input signal A and an input signal B), perform a NOR logic operation, and output a first output signal $V_{OUT1}$.

As an example, the NOR gate 300 may include a first transistor 310, a second transistor 320, a third transistor 330, and a fourth transistor 340. In order to perform a function of the NOR gate, a source of the first transistor 310 may be connected to a power supply voltage $V_{DD}$, a source of the second transistor 320 may be connected to a drain of the first transistor 310. Further, sources of the third and fourth transistors 330 and 340 may be connected to a drain of the second transistor 320, and drains of the third and fourth transistors 330 and 340 may be connected to a ground voltage $V_{SS}$.

For example, each of the first and second transistors 310 and 320 may be a PMOS transistor, and each of the third and fourth transistors 330 and 340 may be an NMOS transistor.

The DTMOS inverter 400 may invert the first output signal $V_{OUT1}$ of the NOR gate 300, and output the inverted first output signal $V_{OUT1}$ as a second output signal $V_{OUT2}$.

As an example, the DTMOS inverter 400 may include a fifth transistor 410 and a sixth transistor 420. In order to perform a function of the DTMOS inverter, a source of the fifth transistor 410 may be connected to the power supply voltage $V_{DD}$, a source of the sixth transistor 420 may be connected to a drain of the fifth transistor 410, a drain of the sixth transistor 420 may be connected to the ground voltage $V_{SS}$, each of gates of the fifth transistor 410 and the sixth transistor 420 may be connected to its own body, and a body voltage may be controlled by a gate voltage. Further, the drain of the fifth transistor 410 and the source of the sixth transistor 420 may be connected to bodies of the first transistor 310, the second transistor 320, the third transistor 330, and the fourth transistor 340.

As an example, the fifth transistor 410 may be a PMOS transistor, and the sixth transistor 420 may be an NMOS transistor.

The first output signal $V_{OUT1}$ may be an output of the NOR gate 300, and simultaneously, the second output signal $V_{OUT2}$ of the DTMOS inverter 400 may be an output of the OR gate 2000 using the Schmitt trigger circuit according to another embodiment of the present disclosure.

Since the drain of the fifth transistor 410 and the source of the sixth transistor 420 are connected to the bodies of the first to fourth transistors 310, 320, 330, and 340, the second output signal $V_{OUT2}$ output from the DTMOS inverter 400 may control a threshold voltage of the NOR gate 300.

When using the first output signal $V_{OUT1}$, a logic operation of the OR gate may be performed, and a function of the Schmitt trigger circuit may be performed, and also the number of transistors may have a value obtained by subtracting 4 from the number of transistors constructing the conventional Schmitt NAND gate of FIG. 1. Accordingly, when using the OR gate using the Schmitt trigger circuit according to another embodiment of the present disclosure, the degree of integration can be improved.

Further, the threshold voltage may include a first threshold voltage $V_{LH}$ and a second threshold voltage $V_{HL}$, the first threshold voltage $V_{LH}$ may be a threshold voltage when the second output signal $V_{OUT2}$ is transited from a "low" level to a "high" level, and the second threshold voltage $V_{HL}$ may be a threshold voltage when the second output signal $V_{OUT2}$ is transited from the "high" level to the "low" level.

Accordingly, a bias of each of the bodies of the transistors constructing the logic gate according to another embodiment of the present disclosure may be determined according to the second output signal $V_{OUT2}$ of the DTMOS inverter 400 which is a final output terminal, and a switching threshold voltage may be varied by a body effect.

Figure 5:
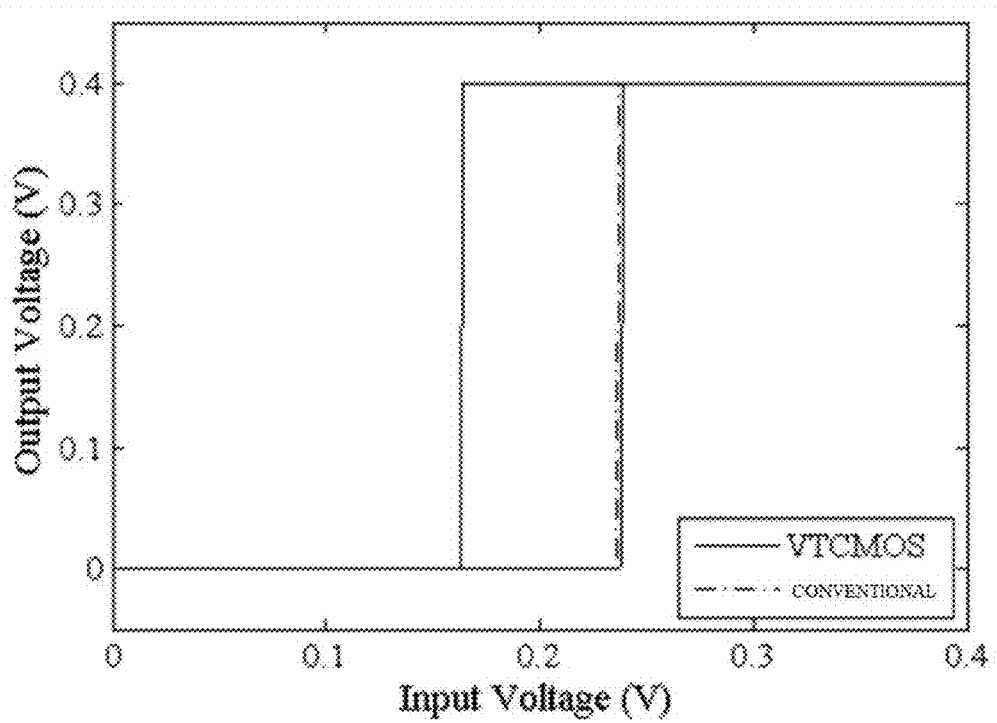
FIG. 5 is a graph comparing hysteresis characteristics between the Schmitt NAND gate of FIG. 1 and the example of the AND gate using the Schmitt trigger of FIG. 2.

FIG. 5 is a graph comparing hysteresis characteristics between the Schmitt NAND gate of FIG. 1 and the AND gate using the Schmitt trigger of FIG. 2. A variable threshold complementary metal oxide semiconductor (VTCMOS) of FIG. 5 illustrates the hysteresis characteristics of the AND gate of FIG. 2.

Referring to FIG. 5, a graph of comparing direct current (DC) characteristics of the Schmitt trigger AND gate having the VTCMOS structure and the DC characteristics of a conventional Schmitt trigger NAND gate is shown. Detailed parameters are shown in the following Table 1.

TABLE 1

| Characteristics | Value | |
| --- | --- | --- |
|  | VTCMOS(Proposed) | Conventional |
| Number of Transistor | 6 | 12(10 + 2) |
| $V_{LH}$ | 239.74 mV | 237.41 mV |
| $V_{HL}$ | 164.45 mV | 164.45 mV |
| Hysteresis Width | 75.29 mV | 72.96 mV |
| Switching Current | 357.42 μA | 1.106 mA |
| Delay | 4.426 ns | 2.564 ns |

When using the VTCMOS structure, it may be confirmed that a low threshold voltage $V_{LH}$ is improved by 2.33 mV. A difference in the characteristics may be caused by a structural difference between the conventional structure (the conventional Schmitt trigger NAND gate) and the VTCMOS structure.

Further, it may be confirmed that the VTCMOS structure is reduced in power consumption by 67% compared with the conventional structure, and is reduced in a size by 50%.

Figure 6:
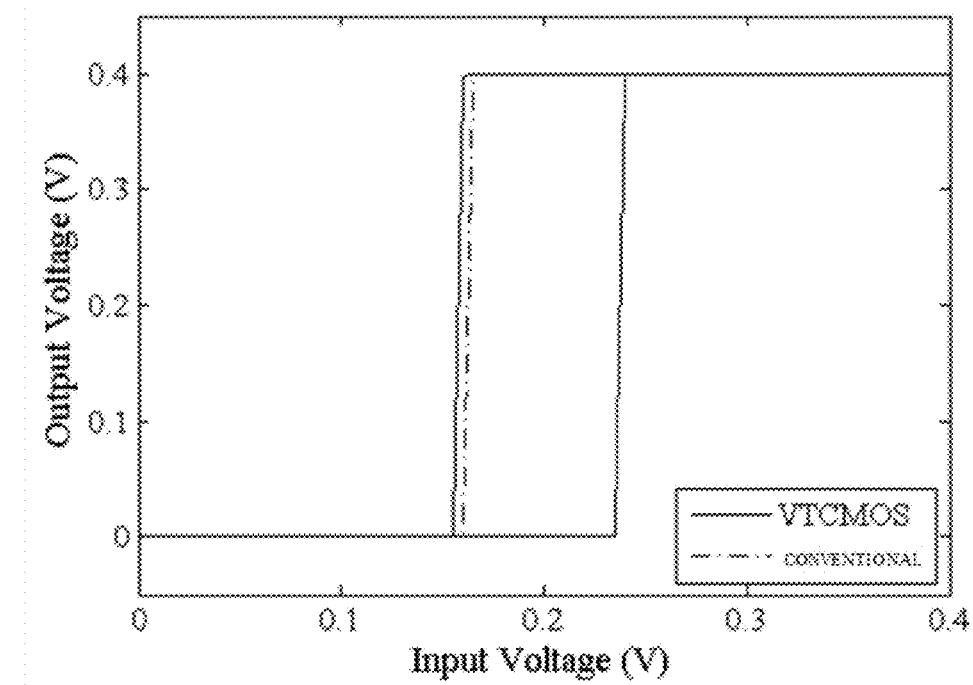
FIG. 6 is a graph comparing hysteresis characteristics between the example of the Schmitt NOR gate of FIG. 3 and the example of the OR gate using the Schmitt trigger of FIG. 4.

FIG. 6 is a graph comparing hysteresis characteristics between the Schmitt NOR gate of FIG. 3 and the OR gate using the Schmitt trigger of FIG. 4. A VTCMOS of FIG. 6 illustrates the hysteresis characteristics of the OR gate of FIG. 4.

Referring to FIG. 6, a graph of comparing direct current (DC) characteristics of the Schmitt trigger OR gate having the VTCMOS structure and the DC characteristics of a conventional Schmitt trigger NOR gate having the DTMOS inverter is shown. Detailed performance comparison parameters are shown in the following Table 2.

TABLE 2

| Characteristic | Value | |
| --- | --- | --- |
|  | VTCMOS (Proposed) | Traditional |
| Number of Transistor | 6 | 12(10 + 2) |
| $V_{LH}$ | 237.5 mV | 237.5 mV |
| $V_{HL}$ | 157.51 mV | 162.5 mV |
| Hysteresis Width | 79.99 mV | 75 mV |
| Switching Current | 123.71 μA | 248.24 μA |
| Delay | 5.576 ns | 3.804 ns |

When using the VTCMOS structure, it may be confirmed that switching power consumption and a size are reduced by 50%. As shown in FIG. 6, the high threshold voltage $V_{HL}$ is improved by 5 mV.

A difference of the characteristics may be caused by a structural difference between the conventional structure (the conventional Schmitt trigger NOR gate) and the VTCMOS structure.

In this case, a substrate of an upper PMOS transistor connected to the ground voltage may generate a forward bias PN junction, and decrease the $V_{TH}$ of the PMOS transistor in which the input signal A is input. This is because a source voltage is lower than the power supply voltage $V_{DD}$.

Figure 7:
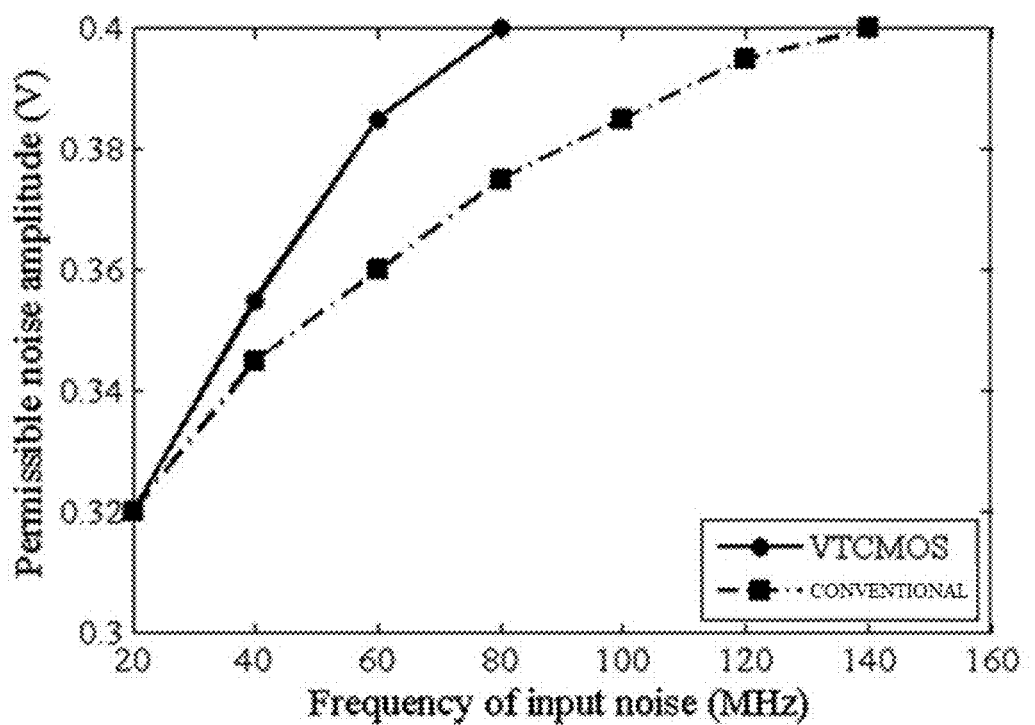
FIG. 7 is a graph comparing noise immunity between the example of the Schmitt NAND gate of FIG. 1 and the example of the AND gate using the Schmitt trigger of FIG. 2.

FIG. 7 is a graph comparing noise immunity between the Schmitt NAND gate of FIG. 1 and the AND gate using the Schmitt trigger of FIG. 2.

Referring to FIG. 7, the AND gate 1000 using the Schmitt trigger according to an embodiment of the present disclosure may have a better improved noise immunity than the Schmitt NAND gate of FIG. 1, and specifically, have a better improved noise immunity in a frequency of an input noise which is over 80 MHz.

Figure 8:
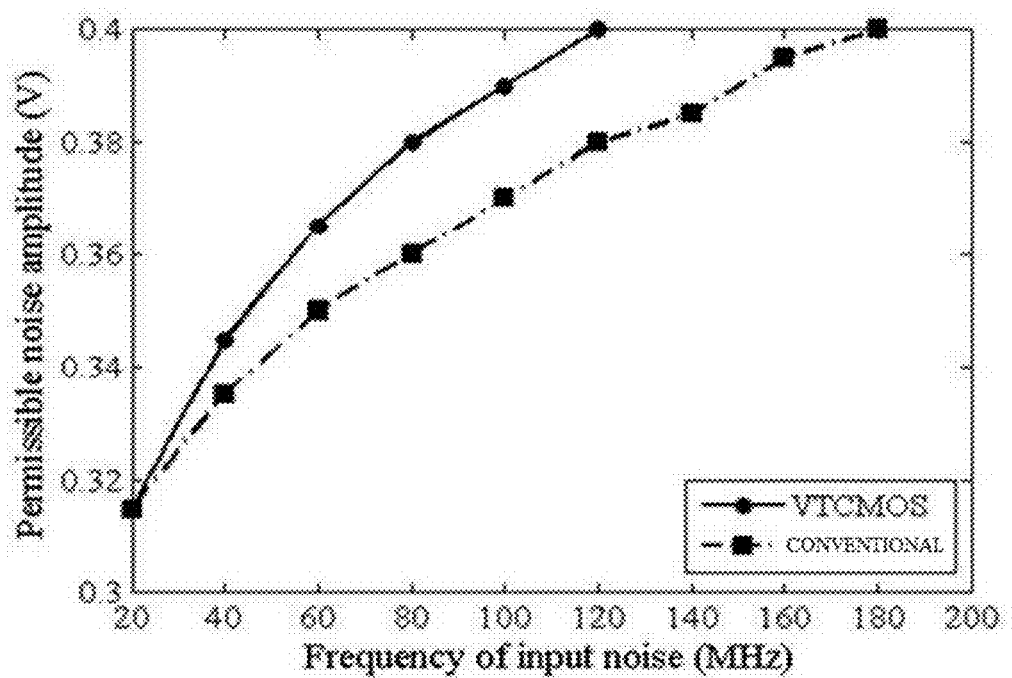
FIG. 8 is a graph comparing noise immunity between the example of the Schmitt NOR gate of FIG. 3 and the example of the OR gate using the Schmitt trigger of FIG. 4.

FIG. 8 is a graph comparing noise immunity between the Schmitt NOR gate of FIG. 3 and the OR gate using the Schmitt trigger of FIG. 4.

Referring to FIG. 8, it may be confirmed that the OR gate 2000 using the Schmitt trigger according to another embodiment of the present disclosure has a better improved noise immunity than the Schmitt NOR gate of FIG. 4.

Figure 9:
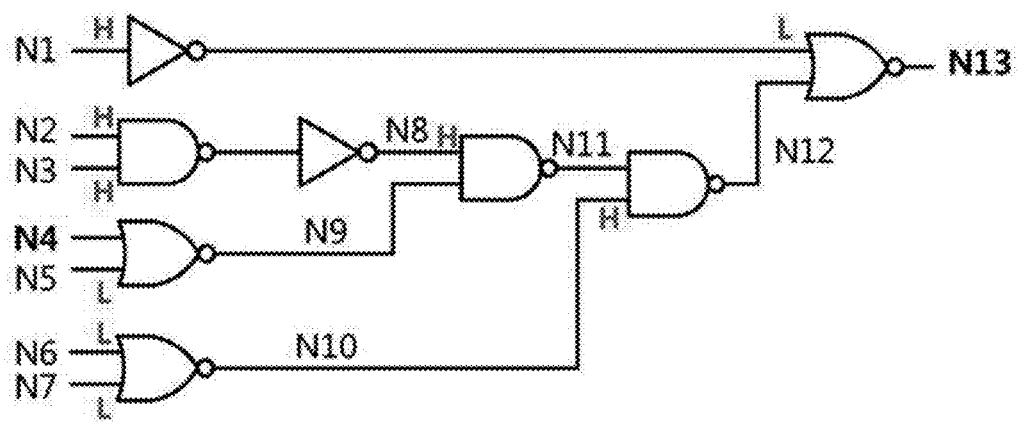
FIG. 9 is a diagram illustrating an experimental circuit for confirming that noise immunity is improved when constructing a circuit using the logic gate according to an embodiment of the present disclosure.
Figure 10:
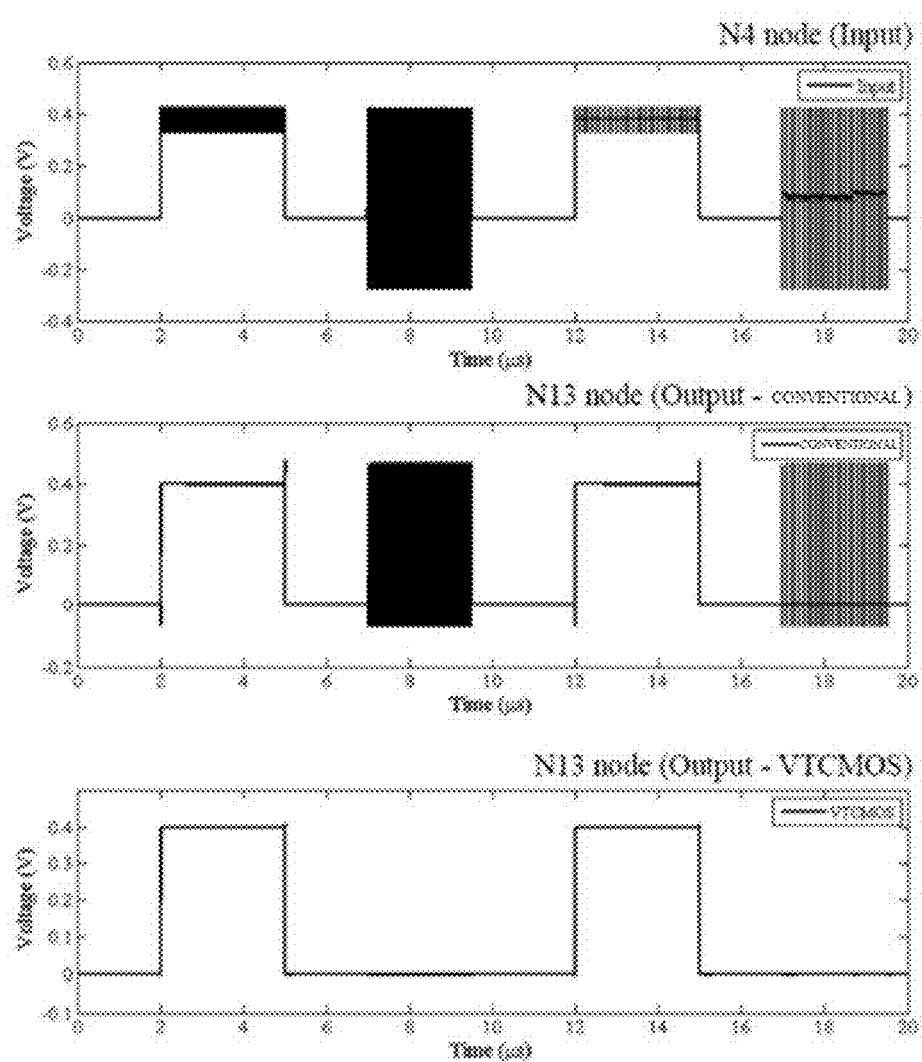
FIG. 10 is a graph illustrating a result of verifying the noise immunity using the experimental circuit of FIG. 9.

FIG. 9 is a diagram illustrating an experimental circuit for confirming that noise immunity is improved when constructing a circuit using the logic gate according to an embodiment of the present disclosure, and FIG. 10 is a graph illustrating a result of verifying the noise immunity using the experimental circuit of FIG. 9.

Referring to FIGS. 9 and 10, when using the AND gate 1000 the OR gate 2000 according to an embodiment of the present disclosure, it may be confirmed that a signal in which noise is removed at a final output terminal is normally output.

According to the present disclosure, a hysteresis width of a logic gate may be improved in comparison with that of the conventional art.

According to the present disclosure, the number of the transistors used in the conventional Schmitt trigger logic gate may be reduced, and the degree of the integration may be improved by reducing the number of the transistors.

According to the present disclosure, a better improved noise immunity may be obtained in comparison to the conventional Schmitt trigger logic gate.

According to the present disclosure, a current consumed when the input signal is transited may be reduced by removing the additional current path for forming the Schmitt trigger.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An AND gate using a Schmitt trigger circuit, comprising:
    a NAND gate configured to receive two input signals, perform a NAND logic operation, and output a first output signal, the NAND gate comprising a first transistor, a second transistor, a third transistor, and a fourth transistor; and
    a dynamic threshold voltage metal oxide semiconductor (DTMOS) inverter configured to invert the first output signal, and output the inverted first output signal as a second output signal, the DTMOS inverter comprising a fifth transistor and a sixth transistor, wherein
    sources of the first and second transistors are connected to a power supply voltage;
    drains of the first and second transistors are connected to each other;
    a source of the third transistor is connected to drains of the first and second transistors;
    a source of the fourth transistor is connected to a drain of the third transistor, and a drain of the fourth transistor is connected to a ground voltage;
    a source of the fifth transistor is connected to the power supply voltage;
    a source of the sixth transistor is connected to a drain of the fifth transistor;
    a drain of the sixth transistor is connected the ground voltage;
    a gate of each of the fifth transistor and the sixth transistor is directly connected to its own body;
    a body voltage is controlled by a gate voltage;
    the drain of the fifth transistor and the source of the sixth transistor are connected to bodies of the first, second, third, and fourth transistor; and
    a threshold voltage of the NAND gate is controlled using the second output signal.

2. The AND gate using the Schmitt trigger circuit of claim 1, wherein the threshold voltage of the NAND gate is controlled by feeding back the second output signal to the bodies of the first, second, third, and fourth transistors.

3. The AND gate using the Schmitt trigger circuit of claim 1, wherein the threshold voltage comprises a first threshold voltage ($V_{LH}$) and a second threshold voltage ($V_{HL}$); and the first threshold voltage ($V_{LH}$) is a threshold voltage when the second output signal is transited from a "low" level to a "high" level, and the second threshold voltage ($V_{HL}$) is a threshold voltage when the second output signal is transited from the "high" level to the "low" level.

4. The AND gate using the Schmitt trigger circuit of claim 1, wherein each of the first and second transistors is a P-channel metal oxide semiconductor (PMOS) transistor, and each of the third and fourth transistors is an N-channel metal oxide semiconductor (NMOS) transistor.

5. The AND gate using the Schmitt trigger circuit of claim 1, wherein the fifth transistor is a PMOS transistor, and the six transistor is an NMOS transistor.

6. An OR gate using a Schmitt trigger circuit, comprising:
    a NOR gate configured to receive two input signals, perform a NOR logic operation, and output a first output signal, the NOR gate comprising a first transistor, a second transistor, a third transistor, and a fourth transistor; and
    a dynamic threshold voltage metal oxide semiconductor (DTMOS) inverter configured to invert the first output signal, and output the inverted first output signal as a second output signal, the DTMOS inverter comprising a fifth transistor and a sixth transistor, wherein
    a source of the first transistor is connected to power supply voltage;
    a source of the second transistor is connected to a drain of the first transistor;
    sources of the third and fourth transistors are connected to a drain of the second transistor;
    drains of the third and fourth transistors are connected to a ground voltage;
    a source of the fifth transistor is connected to the power supply voltage;
    a source of the sixth transistor is connected to a drain of the fifth transistor;
    a drain of the sixth transistor is connected the ground voltage;
    a gate of each of the fifth transistor and the sixth transistor is directly connected to its own body;
    a body voltage is controlled by a gate voltage;
    the drain of the fifth transistor and the source of the sixth transistor are connected to bodies of the first, second, third, and fourth transistor; and
    a threshold voltage of the NOR gate is controlled using the second output signal.

7. The OR gate using the Schmitt trigger circuit of claim 6, wherein the threshold voltage of the NOR gate is controlled by feeding back the second output signal to the bodies of the first, second, third, and fourth transistors.

8. The OR gate using the Schmitt trigger circuit of the claim 6, wherein the threshold voltage comprises a first threshold voltage ($V_{LH}$) and a second threshold voltage ($V_{HL}$); and the first threshold voltage ($V_{LH}$) is a threshold voltage when the second output signal is transited from a "low" level to a "high" level, and the second threshold voltage ($V_{HL}$) is a threshold voltage when the second output signal is transited from the "high" level to the "low" level.

9. The OR gate using the Schmitt trigger circuit of claim 6, wherein each of the first and second transistors is a PMOS transistor, and each of the third and fourth transistors is an NMOS transistor.

10. The OR gate using the Schmitt trigger circuit of claim 6, wherein the fifth transistor is a PMOS transistor, and the six transistor is an NMOS transistor.

11. A Schmitt trigger logic gate, comprising:
- a first logic gate configured to receive two input signals, perform a logic operation, and output a first output signal, the first logic gate comprising a plurality of transistor; and
- a dynamic threshold voltage metal oxide semiconductor (DTMOS) inverter configured to invert the first output signal, and output the inverted first output signal as a second output signal, the DTMOS inverter comprising a first inverter transistor and a second inverter transistor, wherein
- a source of the first inverter transistor is connected to the power supply voltage;
- a source of the second inverter transistor is connected to a drain of the first inverter transistor;
- a drain of the second inverter transistor is connected the ground voltage;
- a gate of each of the first inverter transistor and the second inverter transistor is directly connected to its own body;
- a body voltage is controlled by a gate voltage;
- the drain of the first inverter transistor and the source of the sixth transistor are connected to bodies of the plurality of first logic gate transistors; and
- a threshold voltage of the logic gate is controlled using the second output signal.

12. The Schmitt trigger logic gate of claim 11, wherein the Schmitt trigger logic gate is an AND gate, and the first logic gate is a NAND gate.

13. The Schmitt trigger logic gate of claim 11, wherein the Schmitt trigger logic gate is an OR gate, and the first logic gate is a NOR gate.

* * * * *